US009742384B2

United States Patent
Soenen et al.

(10) Patent No.: US 9,742,384 B2
(45) Date of Patent: Aug. 22, 2017

(54) COMPARATOR CIRCUIT HAVING A CALIBRATION CIRCUIT

(71) Applicant: TAIWAN SEMICONDUCTOR MANUFACTURING COMPANY, LTD., Hsinchu (TW)

(72) Inventors: Eric Soenen, Austin, TX (US); Alan Roth, Leander, TX (US); Justin Shi, Ann Arbor, MI (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/617,183

(22) Filed: Feb. 9, 2015

(65) Prior Publication Data

US 2015/0155859 A1 Jun. 4, 2015

Related U.S. Application Data

(63) Continuation of application No. 13/804,641, filed on Mar. 14, 2013, now Pat. No. 8,988,113.

(60) Provisional application No. 61/611,378, filed on Mar. 15, 2012.

(51) Int. Cl.
| | |
|---|---|
| *H03K 5/22* | (2006.01) |
| *H03K 3/013* | (2006.01) |
| *H03K 5/24* | (2006.01) |
| *H03K 5/02* | (2006.01) |
| *H03K 5/125* | (2006.01) |

(52) U.S. Cl.
CPC ............. *H03K 5/02* (2013.01); *H03K 3/013* (2013.01); *H03K 5/125* (2013.01); *H03K 5/24* (2013.01)

(58) Field of Classification Search
CPC .... H03K 5/2481; H03K 5/249; H03K 5/2418; H04L 25/0272; H03F 3/45183
USPC ........................................ 327/63, 65, 77, 87
See application file for complete search history.

(56) References Cited

U.S. PATENT DOCUMENTS

| | | | |
|---|---|---|---|
| 5,696,508 A * | 12/1997 | Gross, Jr. ............ | H03M 1/1023 341/118 |
| 6,608,582 B2 | 8/2003 | Casper et al. | |
| 7,126,510 B2 | 10/2006 | Alon et al. | |
| 7,622,963 B2 | 11/2009 | Westwick | |
| 7,944,248 B2 | 5/2011 | Nguyen et al. | |
| 2003/0090299 A1 | 5/2003 | Dathe et al. | |
| 2007/0194964 A1* | 8/2007 | Chang et al. ................. | 341/144 |
| 2009/0147885 A1* | 6/2009 | Dimitriu ................. | H04L 25/06 375/319 |

(Continued)

*Primary Examiner* — Quan Tra
(74) *Attorney, Agent, or Firm* — Hauptman Ham, LLP

(57) ABSTRACT

A comparator circuit includes a comparator, a first selection circuit, and a switched-capacitor circuit. The comparator has a first terminal, a second terminal, and an output terminal. The comparator is configured to generate an output signal at the output terminal based on a first signal on the first terminal and a second signal on the second terminal. The first selection circuit is coupled with the first terminal of the comparator and configured to selectively set a first input signal or a first calibration signal as the first signal in response to a control signal. The switched-capacitor circuit is coupled with the output terminal and the second terminal of the comparator. The switched-capacitor circuit is configured to adjust and output the second signal based on the output signal.

20 Claims, 6 Drawing Sheets

(56) References Cited

U.S. PATENT DOCUMENTS

2012/0146825 A1\* 6/2012 Guedon ........................ 341/145
2013/0088375 A1 4/2013 Wu et al.

\* cited by examiner

COMPARATOR CIRCUIT HAVING A CALIBRATION CIRCUIT

PRIORITY CLAIM

The present application is a continuation of U.S. application Ser. No. 13/804,641, filed Mar. 14, 2013, which claims the priority of U.S. Provisional Application No. 61/611,378, filed Mar. 15, 2012, the disclosures of which are incorporated herein by reference in their entireties.

FIELD

The present disclosure is related to a comparator circuit having a calibration circuit.

BACKGROUND

Input offsets in comparators are common. Currently, it is difficult to have sub milli-volt (sub-mV) offsets in comparators made by complementary metal oxide silicon (CMOS) technology. In attempts to achieve such sub-mV offsets, complex circuitries are used, including, for example, correlated double sampling (CDS), chopping, etc. In a CDS technique, the comparator samples a reference voltage, then samples an input signal in every clock cycle. The comparator result is based on the difference between the reference voltage and the input signal. Sampling the reference voltage, however, is difficult. In a chopping technique, a fully-differential system is used. Both differential input signals and differential output signals are swapped at a certain rate. As a result, effects of an offset are cancelled. Further, fixed-pattern noise is added, which subsequently needs to be filtered out.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
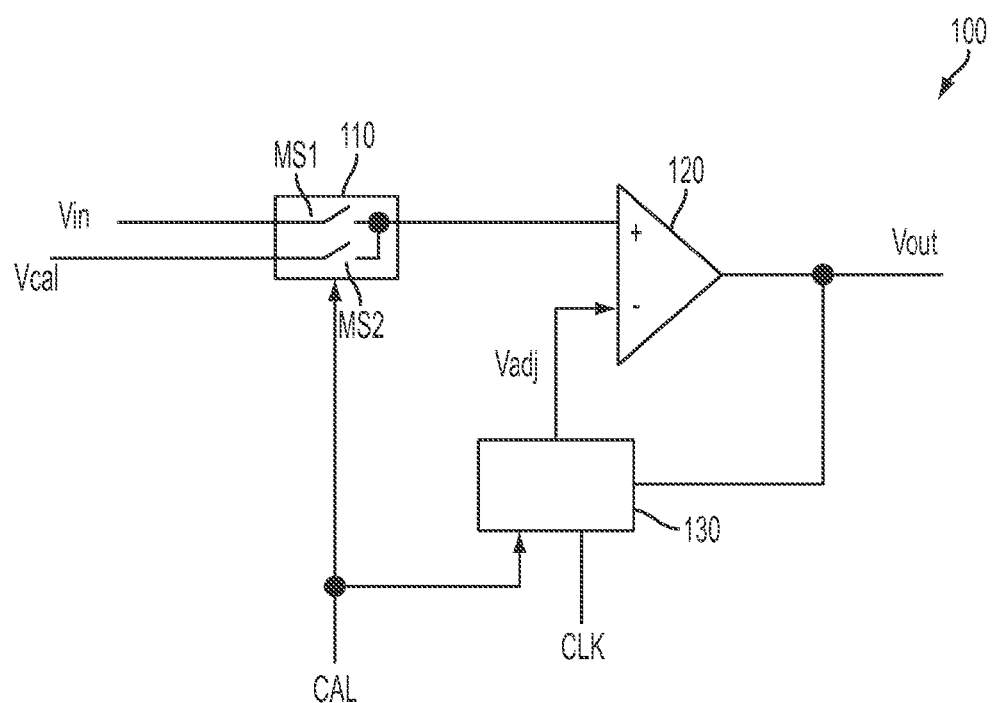
FIG. 1 is a diagram of a comparator circuit having a calibration circuit in a single-ended architecture, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. A voltage comparator circuit includes an adaptive calibration circuit. The resolution at the input of the comparator circuit is below one millivolt (mV). The comparator circuit is suitable for use in power management and analog to digital (AD) converters. In some embodiments, the comparator circuit has a separate input for offset control. The offset adjustment is done in spare cycles when the comparator circuit is not used for its normal comparison mode. An up-down counter circuit is used. The comparator circuit determines the direction for the up-down counter to adjust the offset. A step size for calibration adjustment can be made arbitrarily small. No filtering such as in a chopping technique is used. In some embodiments, switched capacitors are used to implement the offset calibration circuit that uses low overheads.

Comparator Circuit

For simplicity, in this document, a reference name is used for both a node (or a line) and the signal thereon. For example, in FIG. 1, Vout is used to refer to both the output node of a comparator 120 and the signal on the output node.

FIG. 1 is a diagram of a comparator circuit 100, in accordance with some embodiments. In some embodiments, comparator circuit 100 is used in power management systems. Other applications are within the scope of various embodiments.

A multiplexer 110 selects either a signal Vin or a signal Vcal to a non-inverting terminal V+ of a comparator 120. In some embodiments, signal Vin is selected for a normal comparison mode of comparator 120, and signal Vcal is selected for a calibration mode of comparator 120. Further, in at least one embodiment, ground or a voltage VSS (not labeled) is used as signal Vcal. In some embodiments, multiplexer 110 includes switches MS1 and MS2. For example, when switch MS2 is open and switch MS1 is closed, signal Vin is selected for terminal V+. But when switch MS1 is open and switch MS2 is closed, signal Vcal is selected for terminal V+.

Comparator 120 compares the signals at terminals V+ and V−, and generates a signal Vout at the output. If signal V+ is greater than signal V−, comparator 120 generates a high logical value for signal Vout. But if signal V+ is less than signal V−, comparator 120 generates a low logical value for signal Vout. When signal V+ and V− are about the same, comparator 120 is equally likely to produce the same number of high logical and low logical values. In such a condition, the voltage at node V+ (or node V−) is at a threshold of comparator 120.

In some embodiments, in the normal comparison mode of comparator 120, terminal V+ receives signal Vin, and terminal V− has a voltage a constant voltage value. In some embodiments, the constant voltage value is a voltage value of voltage Vadj after calibration. In contrast, in the calibration mode, terminal V+ receives signal Vcal. Based on signal Vout, up-down counter 130 provides voltage Vadj accordingly. In other words, voltage Vadj is adjusted based on signal Vout. For example, if voltage Vin is greater than voltage Vadj, signal Vout is logically high, and voltage Vadj is increased. In contrast, if voltage Vin is lower than voltage Vadj, signal Vout is logically low, and voltage Vadj is decreased. In some embodiments, voltage Vadj is adjusted once per clock cycle of a clock signal CLK. The output of multiplexer 110 at terminal V+ and voltage Vadj at terminal V− of comparator 120 are for illustration. The output of multiplexer 110 at terminal V− and voltage Vadj at terminal V+ of comparator 120 are within the scope of various embodiments. In such a condition, operations of comparator 120 are modified accordingly.

For various reasons, comparator 120 has an input offset at terminals V+ and V−. As a result, when the voltages at terminals V+ and V− are the same, comparator 120 tends to generate a particular logical value, such as a high logical value or a low logical value instead of equally providing the same number of high or low logical values. Up-down counter 130 is used to cancel the effect of the offset at terminals V+ and V−. Expressed differently, up-down counter 130 is used to calibrate comparator 120. In various embodiments, once calibration is complete, the input offset at terminals V+ and V− is canceled. Consequently, comparator 120 is equally likely to produce the same number of logical high and low values when terminals V+ and V− are applied with the same voltage value. Because voltage Vadj is used in calibrating comparator 120, voltage Vadj is also called a calibration voltage or a calibration signal.

In some embodiments, when a signal CAL is logically high, counter 130 is activated and comparator 120 operates in the calibration mode. But when signal CAL is logically low, counter 130 is deactivated, and comparator 120 operates in the normal comparison mode. In effect, signal CAL is used to control the operational modes of comparator 120. In various applications of comparator circuit 100, there are spare times when comparator 120 is not used, signal CAL is applied with a high logical value so that comparator 120 is calibrated in the calibration mode.

Up-Down Counter Circuit

Up-down counter 130 is also called a calibration circuit, an offset-adjusting circuit, etc. In some embodiments, up-down counter 130 is an analog circuit having an output voltage that can be adjusted up or down in small increments defined by capacitors C1 and C2 in FIG. 2 as explained below.

Figure 2:
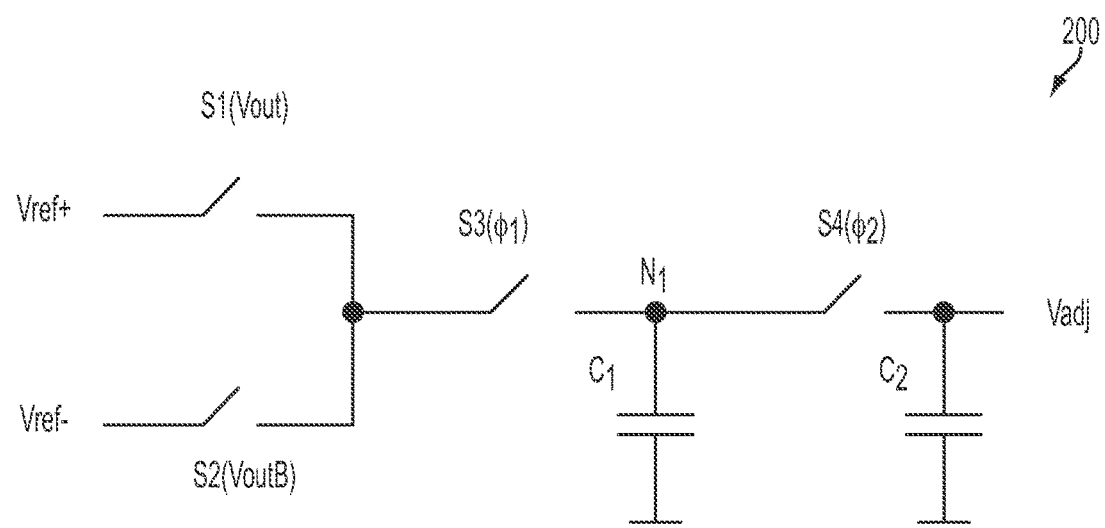
FIG. 2 is a diagram of the up-down counter in the comparator circuit in FIG. 1, in accordance with some embodiments.

FIG. 2 is a diagram of an up-down counter circuit 200, in accordance with some embodiments. Up-down counter circuit 200 is an implementation of up-down counter circuit 130 in FIG. 1.

A reference S1(Vout) indicates that switch S1 is closed when signal Vout in FIG. 1 is logically high. A reference S2(VoutB) indicates that switch S2 is closed when signal Vout is logically low. In some embodiments, counter circuit 200 operates in two different phases Φ1 and Φ2. A reference S3(Φ1) indicates that switch S3 operates in a first phase Φ1. In contrast, a reference S4(Φ2) indicates that switch S4 operates in a second phase Φ2. Because capacitors C1 and C2 are switched in phases Φ1 and Φ2, counter circuit 200 is called a switched-capacitor circuit, a capacitor-based integrator, etc.

Capacitor C1 stores a voltage at a node N1. Capacitor C2 stores voltage Vadj. In some embodiments, capacitor C2 is much larger than capacitor C1. For example, if Crat (not labeled) represents a ratio of a capacitance of capacitor C2 over a capacitance of capacitor C1, ratio Crat is about 40 to 100. For another example, if C1 is 100 fF and C2 is 4 pF, Crat is 40.

Switches S1, S2, and S3 function together to transfer a voltage Vref+ or a voltage Vref− to node N1. For example, in some embodiments, in the first phase Φ1, switch S3 is closed. When signal Vout in FIG. 1 is logically high, switch S2 is open and switch S1 is closed to transfer voltage Vref+ to node N1. In contrast, when switch S3 is closed, and when signal Vout is logically low, switch S1 is open and switch S2 is closed to transfer voltage Vref− to node N1.

A switch S4 is to transfer the voltage on node N1 to node Vadj. For example, after phase Φ1 is complete, node N1 has either voltage Vref+ or Vref−. Switch S3 is then open and switch S4 is closed to transfer either voltage Vref+ or Vref− at node N1 to node Vadj. As a result, after both phases Φ1 and Φ2 are complete, a scaled version of voltage Vref+ or voltage Vref− is added to voltage Vadj. For example, if |Vref| represents the absolute value of either voltage Vref+ or voltage Vref−, voltage Vadj is added with a scaled version of |Vref| or subtracted from a scaled version of |Vref|. In some embodiments, a scaling factor is determined based on ratio Crat. Further, to get a small adjustment, capacitor C1 is selected to be much smaller than capacitor C2. For example, in some embodiments, capacitor C1 is about 1% of capacitor C2. Effectively, when voltage Vout is logically high, voltage Vadj is increased by an amount of voltage |Vref|*C1/C2. But if voltage Vout is logically low, voltage Vadj is decreased by an amount of voltage |Vref|*C1/C2. Whether voltage Vout is logically high or low is determined by an output state of comparator 120 during each clock cycle of the calibration mode.

Differential Comparator Circuit

Persons of ordinary skill in the art will recognize that circuits 100 and 200 are each a single-ended system in which a voltage has a single representation. For example, the input voltage is represented by a single voltage Vin, voltage Vadj is represented by a single reference Vadj, etc.

Figure 3:
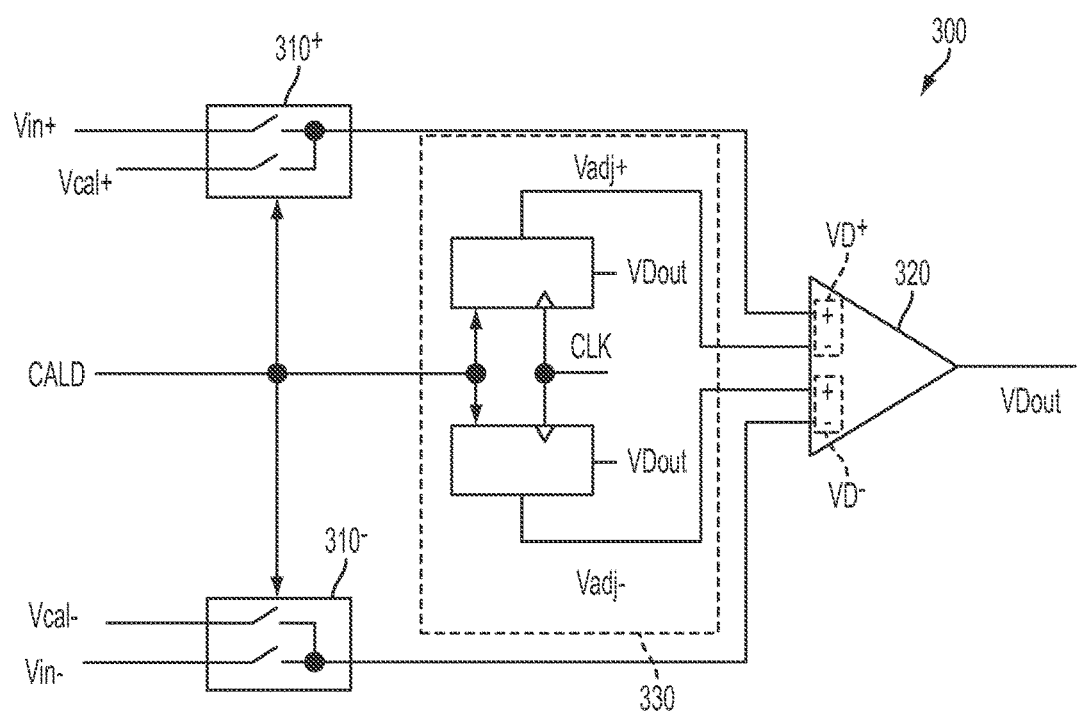
FIG. 3 is a diagram of a comparator circuit having a calibration circuit in a differential architecture, in accordance with some embodiments.

FIG. 3 is a diagram of a comparator circuit 300, in accordance with some embodiments. Comparator circuit 300 is differential in which a voltage is represented by a positive and a negative voltage having the same magnitude or absolute value. For example, voltage Vin is represented by a voltage Vin+ and a voltage Vin−, each having the same absolute value |Vin|. Similarly, voltage Vcal is represented by a voltage Vcal+ and a voltage Vcal−, each having the same absolute value |Vcal|. Voltage Vadj is represented by a voltage Vadj+ and a voltage Vadj−, each having the same absolute value |Vadj|, etc. Each of terminals V+ and V− of comparator 320 has a positive terminal and a negative terminal. For simplicity, both voltages Vcal+ and Vcal− are grounded and thus have 0 V. Other values of voltages Vcal+ and Vcal− are within the scope of various embodiments.

Compared with circuit 100, signals Vin+ and Vin− correspond to signal Vin in circuit 100. Signals Vcal+ and Vcal− correspond to signal Vcal. Signals Vadj+ and Vadj− correspond to signal Vadj. Multiplexers 310+ and 310− correspond to multiplexer 110. A terminal VD+ having a positive terminal and a negative terminal correspond to terminal V+. A terminal VD− having a positive terminal and a negative terminal correspond to terminal V−.

Circuit 300 operates in a manner similar to circuit 100, except that circuit 100 is single-ended while circuit 300 is differential. For example, when a signal CALD is logically low, circuit 300 operates in a normal comparison mode, multiplexer 310+ selects signal Vin+ to the positive terminal of terminal VD+ of comparator 320, and multiplexer 310− selects signal Vin− to the negative terminal of terminal VD− of comparator 320. Comparator 320 then compares the difference of voltages Vin+ and Vin− and the difference of voltages Vadj+ and Vadj−. In other words, if ΔVin represents the difference between Vin+ and Vin− and ΔVadj represents the difference between Vadj+ and Vadj−, comparator 320 compares ΔVin and ΔVadj.

In contrast, when signal CALD is logically high, circuit 300 operates in a calibration mode. Multiplexer 310+ selects signal Vcal+ to the positive terminal of terminal VD+, and multiplexer 310− selects signal Vcal− to the negative terminal of terminal VD−. When signal VDout is logically high, signal Vadj+ at the negative terminal of terminal VD+ is increased while signal Vadj− at the positive terminal of terminal VD− is decreased. Effectively, the absolute value |ΔVadj| is increased. In contrast, when signal VDout is logically low, signal Vadj+ is decreased and signal Vadj− is increased. Effectively, the absolute value |ΔVadj| is decreased.

Up-Down Counter Circuit with Diffential Voltages

Figure 4:
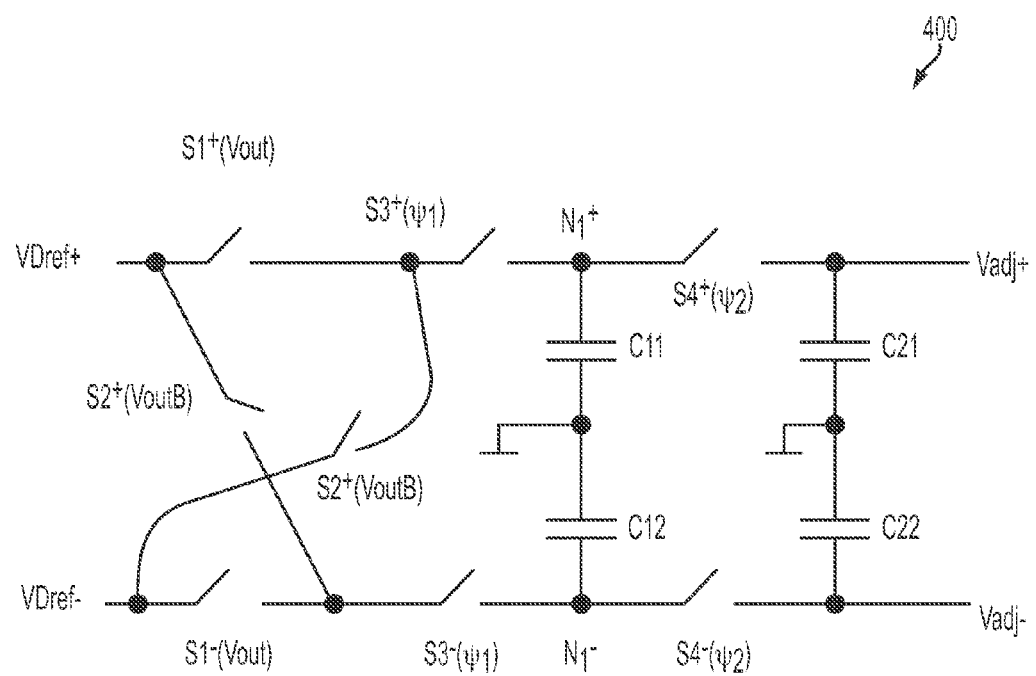
FIG. 4 is a diagram of an up-down counter of the comparator circuit in FIG. 3, in accordance with some embodiments.

FIG. 4 is a diagram of an up-down counter circuit 400, in accordance with some embodiments. Circuit 400 is an implementation of circuit 330, and is also differential.

References S1+(VDout) and S1−(VDout) indicate that both switches S1+ and S1− are closed when signal VDout is logically high. References S2+(VDoutB) and S2− (VDoutB) indicate that both switches S2+ and S2− are closed when signal VDout is logically low. References S3+(ψ1) and S3−(ψ1) indicate that switches S3+ and S3− are closed in a first phase ψ1 of circuit 400. References S4+(ψ2) and S4−(ψ2) indicate that switches S4− and S4− are closed in a second phase ψ2 of circuit 400.

Compared with circuit 200, voltages VDref+ and VDref− correspond to voltages Vref+ and Vref− in circuit 200, respectively. Switches S1+ and S1− correspond to switch S1. Switches S2+ and S2− correspond to switch S2. Switches S3+ and S3− correspond to switch S3. Switches S4+ and S4− correspond to switch S4. Capacitors C11 and C12 correspond to capacitor C1. Capacitors C21 and C22 correspond to capacitor C2. Nodes N1+ and N1− correspond to node N1. Nodes Vadj+ and Vadj− correspond to node Vadj.

In the calibration mode, when signal VDout is logically high, switches S2+ and S2− are open. Switches S1+ and S1− are closed. In the first switching phase ψ1, switches S3+ and S3− are closed. Voltages VDref+ and VDref− are transferred to nodes N1+ and N1−, respectively. After phase ψ1 is complete, switches S3+ and S3− are open, and switches S4+ and S4− are closed. As a result, voltages N1+ and N1− are transferred to nodes Vadj+ and Vadj−, respectively. Effectively, voltage Vadj+ is increased and voltage Vadj− is decreased, and the absolute value |Vadj| is increased.

In contrast, when signal VDout is logically low, switches S1+ and S1− are open. Switches S2+ and S2− are closed. In the first switching phase ψ1, switches S3+ and S3− are closed. Voltages VDref− and VDref+ are transferred to nodes N1+ and N1−, respectively. After phase ψ1 is complete, switches S3+ and S3− are open, and switches S4+ and S4− are closed. As a result, voltages N1+ and N1− are transferred to node Vadj+ and Vadj−, respectively. Effectively, voltage Vadj is decreased and voltage Vadj− is increased, and the absolute value |Vadj| is decreased.

METHODS

Figure 5:
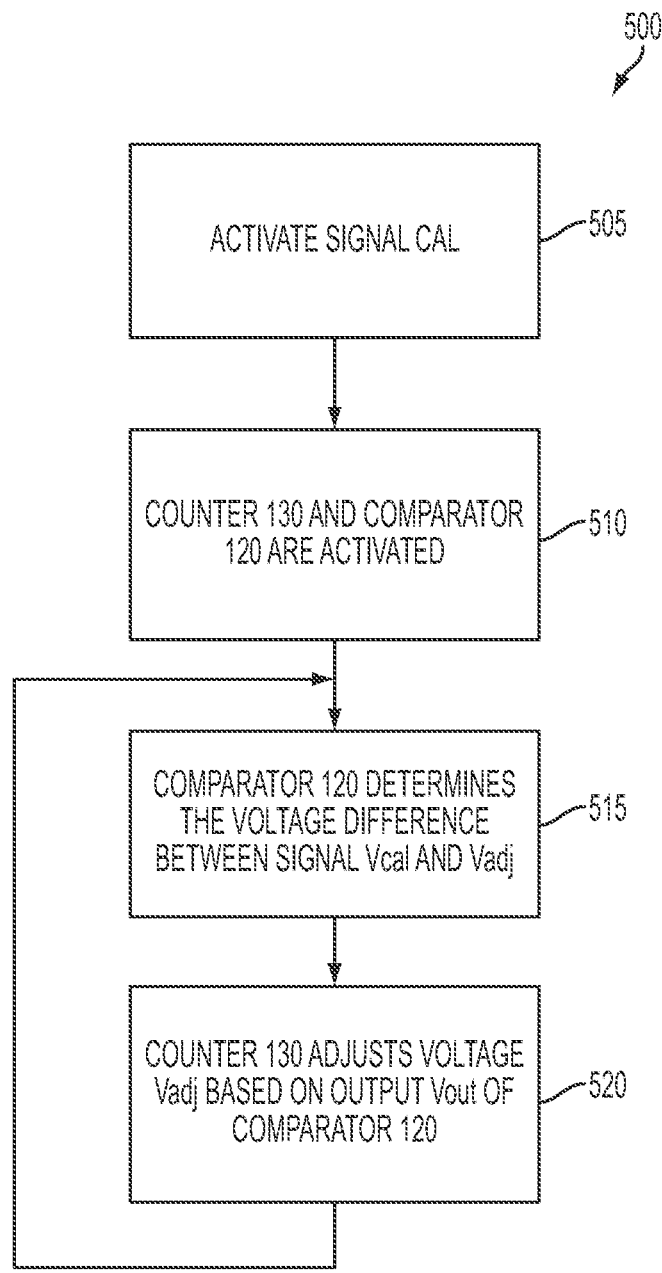
FIG. 5 is a flowchart of a method illustrating the circuit in FIG. 1 operating in a calibration mode, in accordance with some embodiments.

FIG. 5 is a flowchart of a method 500 illustrating an operation of comparator circuit 100, in accordance with some embodiments. In this illustration, comparator circuit 100 operates in the calibration mode, and counter 200 is implemented as counter 130. In some embodiments, the calibration mode is selected at a time when comparator circuit 100 does not need to perform a comparison of voltages.

In operation 505, signal CAL is activated with a high logical value. As a result, multiplexer 110 selects signal Vcal to be input to terminal V+ of comparator 120.

In operation 510, based on signal CAL being activated, counter 130 is activated, and comparator 120 is in the calibration mode.

In operation 515, comparator 120 determines the voltage difference between voltage Vcal and voltage Vadj.

In operation 520, counter 130 adjusts voltage Vadj based on output Vout of comparator 120. For example, if voltage Vcal is greater than voltage Vadj, signal Vout is logically high. As a result, counter 130 increases voltage Vadj. But if voltage Vcal is less than voltage Vadj, counter 130 decreases voltage Vadj.

Operations 515 and 520 are repeated until calibration is done. In some embodiments, output Vout of comparator 120 is checked to determine whether the number of logical high decisions is approximately equal to the number of logical low decisions. In other words, the calibration is done when comparator 120 is equally likely to generate a high logical value and a low logical value at output Vout. In some other embodiments, the calibration mode is kept active for a time long enough such that, based on a theoretical analysis of circuit 100 and a system using circuit 100, the number of logical high decisions is approximately equal to the number of logical low decisions.

Figure 6:
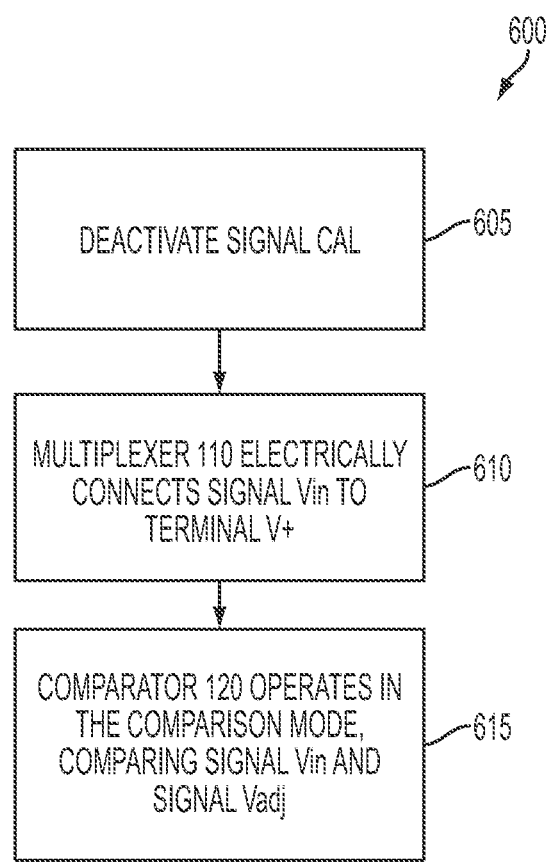
FIG. 6 is a flowchart of a method illustrating the circuit in FIG. 1 operating in a normal comparison mode, in accordance with some embodiments.

FIG. 6 is a flowchart of a method 600 illustrating an operation of circuit 100, in accordance with some embodiments. In this illustration, circuit 100 operates in the normal comparison mode. Comparator 120 has been calibrated using the method in FIG. 5.

In operation 605, signal CAL is deactivated with a low logical value. As a result, counter 130 is disabled. Comparator 120 operates in the normal comparison mode. In such a condition, in some embodiments, voltage Vadj is at a constant voltage level. In some embodiments, the normal comparison mode is selected when comparator 100 is to perform a comparison between two signals that is close to each other, such as, for example, in some precision analog to digital converters, in power management circuits where the direction of a current is determined based on a voltage drop across a small resistor.

In operation 610, based on the deactivated signal CAL, multiplexer 110 electrically couples signal Vin to non-inverting terminal V+ of comparator 120.

In operation 615, comparator 120 operates normally as a comparator having signals Vin and Vadj as inputs. Operations of comparator 120 should be recognizable by persons of ordinary skill in the art.

In FIGS. 5 and 6, circuits 100 and 200 are used for illustration. Operations of circuits 300 and 400 are similar but in differential architecture, and should be recognizable by persons of ordinary skill in the art.

A number of embodiments have been described. It will nevertheless be understood that various modifications may be made without departing from the spirit and scope of the disclosure. For example, the low or high logical values of various signals used in the above description are for illustration. Various embodiments are not limited to a particular level when a signal is activated and/or deactivated. Selecting different levels is within the scope of various embodiments.

In accordance with an embodiment, a comparator circuit includes a comparator, a first selection circuit, and a switched-capacitor circuit. The comparator has a first terminal, a second terminal, and an output terminal. The comparator is configured to generate an output signal at the output terminal based on a first signal on the first terminal and a second signal on the second terminal. The first selection circuit is coupled with the first terminal of the comparator and configured to selectively set a first input signal or a first calibration signal as the first signal in response to a control signal. The switched-capacitor circuit is coupled with the output terminal and the second terminal of the comparator. The switched-capacitor circuit is configured to adjust and output the second signal based on the output signal.

In accordance with another embodiment, a method includes outputting, by a comparator, an output signal at an output terminal of the comparator based on comparing a voltage level of a first signal at a first terminal of the comparator and a voltage level of a second signal at a second terminal of the comparator. Responsive to a first logical state of a control signal, a calibration signal is set as the first signal at the first terminal of the comparator; and the voltage level of the second signal at the second terminal of the comparator is adjusted by a switched-capacitor circuit based on the output signal at the output terminal of the comparator.

In accordance with another embodiment, a method includes outputting, by a comparator, an output signal at an output terminal of the comparator based on comparing a first value and a second value. The first value corresponds to a difference between a voltage level of a first signal at a first terminal of the comparator and a voltage level of a second signal at a second terminal of the comparator. The second value corresponds to a difference of a voltage level of a third signal at a third terminal of the comparator and a voltage level of a fourth signal at a fourth terminal of the comparator. Responsive to a first logical state of a control signal, a first calibration signal is set as the first signal at the first terminal of the comparator; a second calibration signal is set as the third signal at the third terminal of the comparator; and the voltage level of the second signal at the second terminal of the comparator and the voltage level of the fourth signal at the fourth terminal of the comparator are adjusted by a switched-capacitor circuit based on the output signal at the output terminal of the comparator.

Various figures show the capacitor circuits using discrete capacitors for illustration. Equivalent circuitry may be used. For example, a capacitive device, circuitry or network (e.g., a combination of capacitors, capacitive devices, circuitry, etc.) can be used in place of the capacitor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A comparator circuit comprising:
a comparator having a first terminal, a second terminal, and an output terminal, the comparator being configured to generate an output signal at the output terminal based on a first signal on the first terminal and a second signal on the second terminal;
a first selection circuit coupled with the first terminal of the comparator and configured to set a first input signal as the first signal in response to a control signal having a first logical value and a first calibration signal as the first signal in response to the control signal having a second logical value different from the first logical value; and
a switched-capacitor circuit coupled with the output terminal and the second terminal of the comparator, the switched-capacitor circuit being configured to adjust and output the second signal based on the output signal, wherein the comparator is configured to:
generate the output signal based on the first input signal and the second signal in response to the control signal having the first logical value, and
generate the output signal based on the first calibration signal and the second signal in response to the control signal having the second logical value; and
wherein:
the comparator further comprises a third terminal and a fourth terminal, the comparator being configured to generate the output signal at the output terminal based on the first signal on the first terminal, the second signal on the second terminal, a third signal on the third terminal, and a fourth signal on the fourth terminal;
the switched-capacitor circuit is coupled with the second terminal and the fourth terminal of the comparator, the switched-capacitor circuit being configured to adjust and output the fourth signal based on the output signal; and
the comparator circuit further comprises a second selection circuit coupled with the third terminal of the comparator and configured to selectively set a second input signal or a second calibration signal as the third signal in response to the control signal.

2. The comparator circuit of claim 1, wherein the switched-capacitor circuit comprises:
a first node;
a first capacitive device coupled with the first node;
a second node;
a second capacitive device coupled with the second node;
a third node;
a first switch coupled between the third node and a first reference voltage;
a second switch coupled between the third node and a second reference voltage;
a third switch coupled between the first node and the third node; and
a fourth switch coupled between the first node and the second node.

3. The comparator circuit of claim 2, wherein
the first capacitive device has a first capacitance value;
the second capacitive device has a second capacitance value; and
a capacitance ratio of the switched-capacitor circuit is determined based on a predetermined step size of adjustment.

4. The comparator circuit of claim 3, wherein the capacitance ratio ranges from 40 to 100.

5. The comparator circuit of claim 2, wherein
the first switch is set to be closed responsive to a first logical state of the output signal at the output terminal of the comparator; and
the second switch is set to be closed responsive to a second logical state of the output signal at the output terminal of the comparator.

6. The comparator circuit of claim 2, wherein
the third switch is controlled based on a first phase signal;
the fourth switch is controlled based on a second phase signal; and the third switch and the fourth switch are free from being set to be closed concurrently.

7. The circuit of claim 1, wherein the switched-capacitor circuit is configured to
increase a voltage level of the second signal based on a first logical value of the output signal at the output terminal of the comparator; and
decrease the voltage level of the second signal based on a second logical value of the output signal at the output terminal of the comparator.

8. The comparator circuit of claim 1, wherein the switched-capacitor circuit is configured to
adjust a voltage level of the second signal responsive to a first logical value of the control signal; and
maintain the voltage level of the second signal responsive to a second logical value of the control signal.

9. The comparator circuit of claim 1, wherein the switched-capacitor circuit comprises:
a first node;
a second node;
a third node;
a fourth node;
a first capacitive device coupled between the first node and the third node;
a second capacitive device coupled between the second node and the fourth node;
a fifth node;
a sixth node;
a first switch coupled between the fifth node and a first reference voltage;
a second switch coupled between the fifth node and a second reference voltage;
a third switch coupled between the sixth node and the second reference voltage;
a fourth switch coupled between the sixth node and the first reference voltage;
a fifth switch coupled between the first node and the fifth node;
a sixth switch coupled between the first node and the second node;
a seventh switch coupled between the third node and the sixth node; and
an eighth switch coupled between the third node and the fourth node.

10. The comparator circuit of claim 9, wherein
the first switch is set to be closed responsive to a first logical state of the output signal at the output terminal of the comparator;
the second switch is set to be closed responsive to a second logical state of the output signal at the output terminal of the comparator;
the third switch is set to be closed responsive to the second logical state of the output signal at the output terminal of the comparator; and
the fourth switch is set to be closed responsive the first logical state of the output signal at the output terminal of the comparator.

11. The comparator circuit of claim 9, wherein
the fifth switch and the seventh switch are controlled based on a first phase signal;
the sixth switch and the eight switch are controlled based on a second phase signal;
the fifth switch and the sixth switch are free being set to be closed concurrently; and
the seventh switch and the eight switch are free being set to be closed concurrently.

12. The comparator circuit of claim 9, wherein the switched-capacitor circuit is configured to
adjust a voltage level of the second signal and a voltage level of the fourth signal responsive to the first logical value of the control signal; and
maintain the voltage level of the second signal and the voltage level of the fourth signal responsive to the second logical value of the control signal.

13. A method comprising:
outputting, by a comparator, an output signal at an output terminal of the comparator based on a voltage level of a first signal at a first terminal of the comparator, a voltage level of a second signal at a second terminal of the comparator, a voltage level of a third signal at a third terminal of the comparator, and a voltage level of a fourth signal at a fourth terminal of the comparator;
responsive to a first logical state of a control signal:
setting a first calibration signal as the first signal at the first terminal of the comparator and a second calibration signal as the third signal at the third terminal of the comparator; and
adjusting, by a switched-capacitor circuit, the voltage level of the second signal at the second terminal of the comparator and the voltage level of the fourth signal at the fourth terminal of the comparator based on the output signal at the output terminal of the comparator; and
responsive to a second logical state of the control signal:
setting a first input signal as the first signal at the first terminal of the comparator and a second input signal as the third signal at the third terminal of the comparator; and
outputting, by the comparator, an output voltage at the output terminal based on the voltage level of the second signal, the voltage level of the fourth signal, the first input signal, and the second input signal.

14. The method of claim 13, further comprising:
responsive to a second logical state of the control signal:
setting an input signal as the first signal at the first terminal of the comparator; and
stopping adjusting the voltage level of the second signal by the switched-capacitor circuit.

15. The method of claim 13, wherein the adjusting the voltage level of the second signal is performed further based on a clock signal.

16. The method of claim 13, wherein the adjusting the voltage level of the second signal comprises:
increasing the voltage level of the second signal responsive to a first logical value of the output signal at the output terminal of the comparator; and
decreasing the voltage level of the second signal responsive to a second logical value of the output signal at the output terminal of the comparator.

17. A method comprising:
outputting, by a comparator, an output signal at an output terminal of the comparator based on comparing a first value and a second value, the first value corresponding to a difference between a voltage level of a first signal at a first terminal of the comparator and a voltage level of a second signal at a second terminal of the comparator, and the second value corresponding to a difference of a voltage level of a third signal at a third terminal of the comparator and a voltage level of a fourth signal at a fourth terminal of the comparator; and
responsive to a first logical state of a control signal:
setting a first calibration signal as the first signal at the first terminal of the comparator;

setting a second calibration signal as the third signal at the third terminal of the comparator; and adjusting, by a switched-capacitor circuit, the voltage level of the second signal at the second terminal of the comparator and the voltage level of the fourth signal at the fourth terminal of the comparator based on the output signal at the output terminal of the comparator.

18. The method of claim 17, further comprising:

responsive to a second logical state of the control signal:

setting a first input signal as the first signal at the first terminal of the comparator;

setting a second input signal as the third signal at the third terminal of the comparator; and stopping adjusting the voltage levels of the second signal and the fourth signal by the switched-capacitor circuit.

19. The method of claim 17, wherein the adjusting the voltage level of the second signal and the voltage level of the fourth signal comprises:

increasing a difference between the voltage level of the second signal and the voltage level of the fourth signal responsive to a first logical value of the output signal at the output terminal of the comparator; and decreasing the difference between the voltage level of the second signal and the voltage level of the fourth signal responsive to a second logical value of the output signal at the output terminal of the comparator.

20. The method of claim 13, further comprising selectively setting a second input signal or a second calibration signal as the third signal in response to the control signal.

* * * * *